Figure 1:
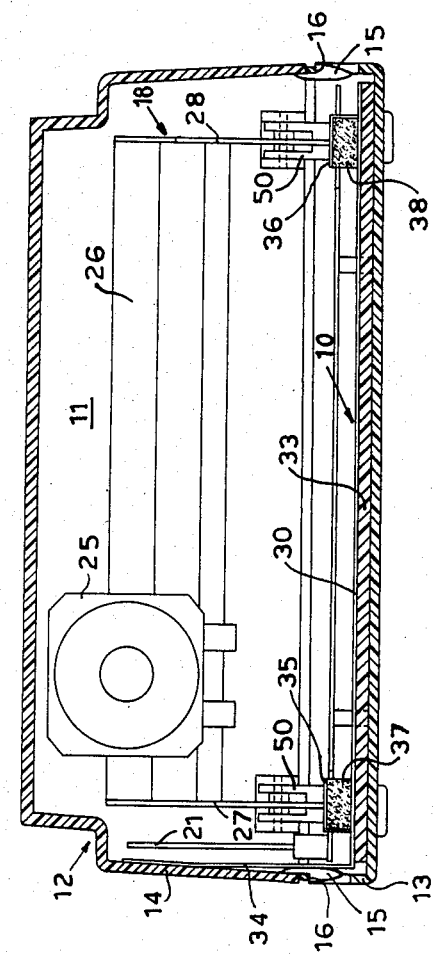

United States Patent [19]

Costa et al.

[11] Patent Number: 4,510,345

[45] Date of Patent: Apr. 9, 1985

[54] SCREEN FOR ELECTRICAL CIRCUITS

[75] Inventors: Armando Costa, Ivrea; Federico Morbin, Candelo, both of Italy

[73] Assignee: Ing. C. Olivetti & C., S.p.A., Ivrea, Italy

[21] Appl. No.: 400,113

[22] Filed: Jul. 20, 1982

[30] Foreign Application Priority Data

Jul. 23, 1981 [IT] Italy ............................ 68022 A/81

[51] Int. Cl.³ ............................................. H05K 9/00
[52] U.S. Cl. .................................. 174/35 R; 400/693
[58] Field of Search .................. 174/35 R, 35 MS; 361/424; 428/458; 400/691, 693, 694; 235/59 T, 60 TW

[56] References Cited

U.S. PATENT DOCUMENTS 3,512,946  5/1970  Hutkin ........................... 428/458 X
4,399,487  8/1983  Neumann ...................... 361/424 X

FOREIGN PATENT DOCUMENTS 2828639 10/1979  Fed. Rep. of Germany .... 174/35 R
1088408 10/1967  United Kingdom ......... 174/35 MS Primary Examiner—A. T. Grimley
Assistant Examiner—D. A. Tone
Attorney, Agent, or Firm—Banner, Birch, McKie & Beckett

[57] ABSTRACT

A screen (30) is suitable for screening the electronic circuits (20) of an office machine with a plastic base (13) and hinged cover (14). The screen (30) comprises a thin, flexible insulating layer metallized on its underside and is disposed below the circuits (20). Screening above is provided by the metal mechanical parts (18) which make electrical contact with the metallized layer by pressing onto tabs (35,36) of the screen, bent over resilient pads.

9 Claims, 4 Drawing Figures

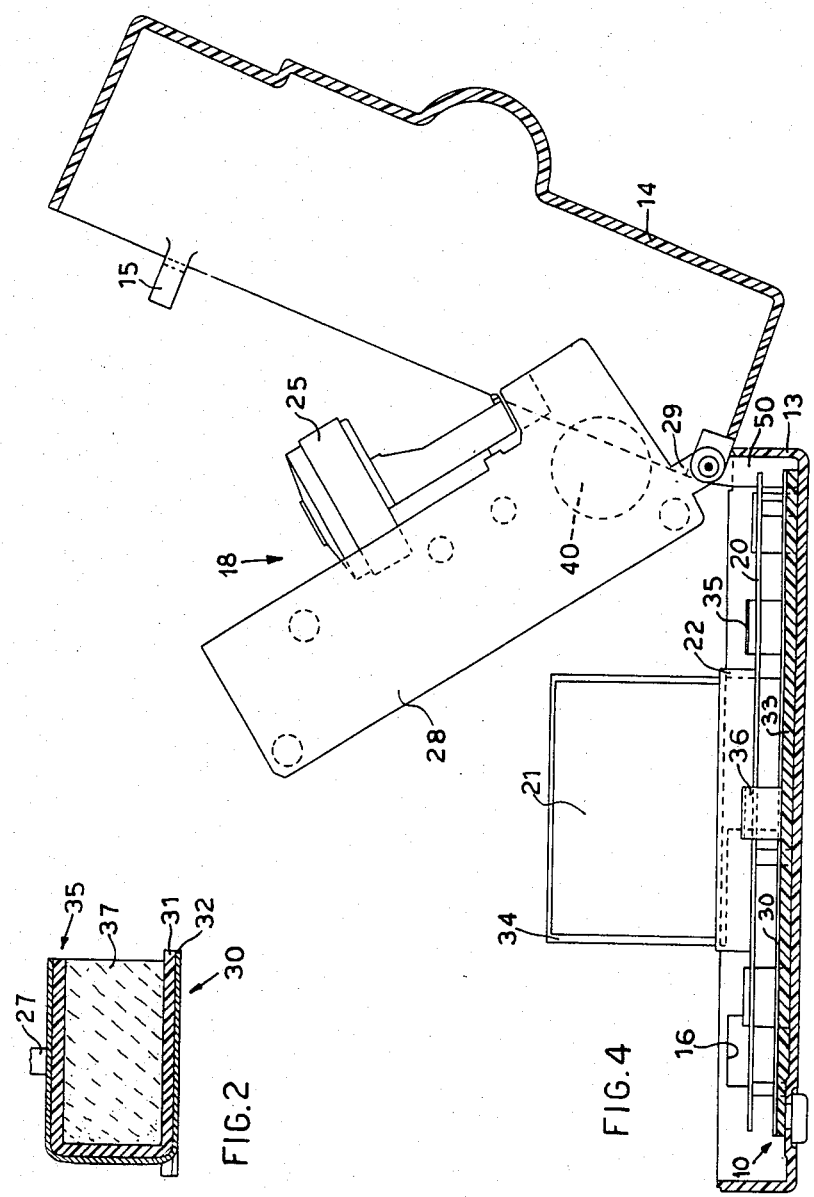

SCREEN FOR ELECTRICAL CIRCUITS

BACKGROUND OF THE INVENTION

The present invention relates to a screen for screening electrical and electronic circuits from the influence of any external magnetic and electrical fields. More particularly, the invention relates to screening circuits which are mounted for example on accounting machines, word processors, teleprinters, data terminals or other like machines.

In present machines of such type, to make them economical and light, the casings are normally of plastic material and the electrical circuits are usually disposed either between the mechanical parts of the machine and the bottom of the casing or between a side portion of the casing and the mechanical parts. Because the mechanical parts represent a considerable metal mass, they in turn in themselves provide good screening for the circuits, on the side on which the mechanical parts are disposed. To complete the screening for such circuits, a process is known which provides for internally coating the casing with a layer of metal which is produced for example by the known flame application process. The metal layer on the casing is then connected to the metal mechanical parts of the machine by means of conductors. When the mechanical parts are designed to be removable with respect to the casing, suitable connectors must be used to connect the two parts together.

This screening system, while guaranteeing good results, nonetheless suffers from the disadvantage of being too expensive.

The object of the present invention is to provide a screen for screening electrical circuits, which is simple, reliable and very economical. The screen according to the invention is characterised by a flexible sheet having an insulating layer towards the circuit to be screened, and a metal layer carried by the insulating layer.

A subsidiary object of the invention is to provide a screen wherein the parts of the screen can be easily connected to the mechanical parts of the machine, without the use of connectors.

Thus, the screen may be further characterised in that at least one portion of the flexible sheet is bent in such a way as to bring the corresponding metal layer into contact with the metal parts of the machine, and that a resilient element constantly urges this portion against the metal parts.

Figure 3:
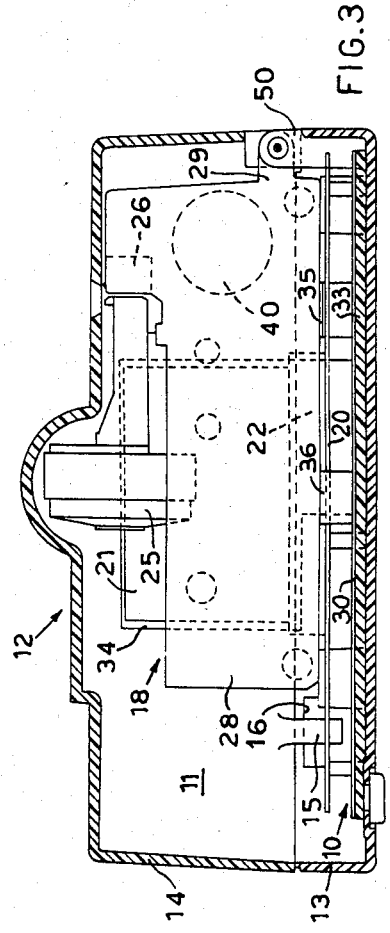

The invention will be described in more detail, by way of example, with reference to the accompanying drawings in which:

FIG. 1 is a partly sectional front view of a screen according to the invention, in an office machine, FIG. 2 is a detail view on an enlarged scale of a part of the screen, FIG. 3 is a diagrammatic and partly sectional side view of the machine shown in FIG. 1, and FIG. 4 is a diagrammatic and partially sectional side view of the machine, shown with some parts in an open position.

Referring to FIGS. 1 and 3, a screen 10 according to the invention is mounted in an office typewriter 11 comprising a casing 12 of plastic material, having a lower base portion 13 and an upper cover 14 which is pivoted on lugs 50 of the lower portion 13 and which can be swung open as shown in FIG. 4. The cover 14 is provided with two side catches 15 (FIGS. 1 and 3) which engage in corresponding apertures 16 provided on the side walls of the lower base portion 13.

The mechanical parts 18 of the machine and the electrical circuits which are mounted on two circuit boards 20 and 21, are disposed within the casing 12. The board 20 which is the larger board is disposed horizontally adjacent the bottom of the base portion 13 while the board 21 is disposed vertically adjacent one side of the machine and is connected to the main board 20 by a connector 22.

The mechanical parts 18 comprise a print head 25, a transverse metal bar 26, a motor 40 for moving the head in front of the bar 26, operating members for the paper, the motor for paper feed and other devices which are not shown in the drawing. The mechanical parts 18 are disposed between two metal side plates 27 and 28 which are connected together by transverse bars, also made of metal.

The side plates 27 and 28 have rear lugs 29 by means of which they are pivoted on the lugs 50 of the base portion 13 of the casing 12. In this manner, when the cover 14 is an open condition (see FIG. 4), the mechanical parts can also be easily raised to permit access to the board 20 disposed therebelow.

The screen 10 according to the invention comprises a flexible foil or sheet 30 formed by a layer 31 of plastic material (see FIG. 2), for example the material sold under the Trade Mark Mylar, which is about 100 microns in thickness, and a metal layer 32, for example aluminium, which is some tens of microns thick. The flexible sheet 30 is parallel to the board 20 (see FIGS. 1 and 3), rests on a support 33 which is disposed on the bottom of the casing and has an upwardly bent side edge portion 34 which is parallel to the board 21.

In this particular embodiment, the screening sheet is not also disposed over the board 20, since the mechanical parts 18 provide magnetic and electrical screening for the circuits therebelow. It is however necessary for the parts 18 to be connected to the metal layer 32 of the flexible sheet, in order to complete the screening.

In accordance with one of the characteristic aspects of the present invention, two side tabs 35 and 36 of the flexible sheet 30 are bent up and over respective resilient sponges 37 and 38 so that each forms a C-shaped configuration, (FIG. 2). In this manner, when the mechanical parts 18 are closed, the side plates 27 and 28 thereof bear against the metal layer 32 (see FIG. 4) and the sponges 37 and 38 ensure contact. This clearly shows the manner in which the metal parts of the screen 10 can be easily connected to the mechanical parts of the machine, without using connectors.

It is obvious that modifications and additions of components may be made in respect of the apparatus as described hereinbefore, without departing from the scope of the invention. In particular, the screen may be of a different form from that illustrated, and adapted to the dimensions of the boards which carry the circuits to be screened.

What we claim is:

1. An office machine comprising a casing of non-metallic material, a plurality of metal mechanical parts mounted into said casing, at least one electrical circuit mounted into said casing, and means for screening said electrical circuit, said screening means comprising a flexible sheet having a first layer of insulating material and a second layer of metallic material carried by said first layer of insulating material, said flexible sheet being interposed between said casing and said electrical circuit in such a manner that said electrical circuit is disposed between said plurality of metal mechanical parts and said flexible sheet.

2. An office machine according to claim 1, wherein said metal layer is of aluminum.

3. An office machine according to claim 1, wherein said second layer of said flexible sheet is connected to said metal mechanical parts.

4. An office machine according to claim 3, wherein said flexible sheet has at least one portion which is bent towards said metal mechanical parts and wherein a resilient element constantly urges said portion against said metal mechanical parts.

5. An office machine according to claim 4, wherein said portion of said flexible sheet is wrapped over a resilient pad.

6. An office machine according to claim 1, wherein said casing comprises a lower base portion and an openable upper cover which is pivoted on lugs of said base portion and wherein said metal mechanical parts are also pivoted on said lugs so as to be capable of being raised with respect to said base portion.

7. An office machine according to claim 6, wherein said electric circuit is disposed on said lower base portion under said metal mechanical parts, and wherein said flexible sheet is disposed on said lower base portion, below said electric circuit.

8. An office machine according to claim 3, wherein said second layer of said flexible sheet is connected to the ground of said electrical circuit.

9. An office machine according to claim 3, wherein the thickness of said metal layer of said flexible sheet is some tens of microns and wherein the thickness of said insulating layer of said flexible sheet is about 100 microns.

* * * * *